(12) United States Patent
You

(10) Patent No.: US 10,716,228 B2
(45) Date of Patent: Jul. 14, 2020

(54) SUPPORT MECHANISM AND MOBILE TERMINAL

(71) Applicant: ZTE CORPORATION, Shenzhen, Guangdong (CN)

(72) Inventor: Yulin You, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 16/413,717

(22) Filed: May 16, 2019

(65) Prior Publication Data

US 2019/0274228 A1    Sep. 5, 2019

Related U.S. Application Data

(63) Continuation of application No. PCT/CN2017/088217, filed on Jun. 14, 2017.

(30) Foreign Application Priority Data

Nov. 17, 2016  (CN) .......................... 2016 1 1027773

(51) Int. Cl.
 *H05K 5/00*   (2006.01)
 *H05K 5/02*   (2006.01)
 (Continued)

(52) U.S. Cl.
 CPC ............. *H05K 5/0226* (2013.01); *E05D 3/18* (2013.01); *E05F 1/12* (2013.01); *F16H 1/06* (2013.01);
 (Continued)

(58) Field of Classification Search
 None
 See application file for complete search history.

(56) References Cited

U.S. PATENT DOCUMENTS

| 9,348,450 B1 * | 5/2016 | Kim ...................... G06F 1/1681 |
| 2010/0075717 A1 * | 3/2010 | Ou ........................ G06F 1/1616 |
| | | 455/566 |

(Continued)

FOREIGN PATENT DOCUMENTS

| CN | 205510132 U | 8/2016 |
| CN | 205596165 U | 9/2016 |

(Continued)

OTHER PUBLICATIONS

Int Search Report/Written Opinion cited in PCT Application No. PCT/CN2017/088217 dated Sep. 20, 2017, 7 pgs.

(Continued)

*Primary Examiner* — Courtney L Smith
*Assistant Examiner* — Rashen E Morrison
(74) *Attorney, Agent, or Firm* — Cooper Legal Group, LLC

(57) ABSTRACT

A support mechanism and a mobile terminal are provided. The support mechanism comprises: a first support plate, a second support plate, and a transmission mechanism for connecting the first support plate with the second support plate. When the support mechanism is in a support state, the first support plate and the second support plate are in a first relative position with respect to each other to form a support surface. The mobile terminal includes a first body, a second body connected to the first body, a support mechanism and a display screen. The display screen comprises: fixed portions fixed to at least one of the first body or the second body, and a deformable portion. The support mechanism is arranged on the second body.

16 Claims, 11 Drawing Sheets

(51) Int. Cl.
*E05D 3/18* (2006.01)
*E05F 1/12* (2006.01)
*F16H 21/44* (2006.01)
*F16H 1/06* (2006.01)
*F16M 11/04* (2006.01)
*H04M 1/02* (2006.01)

(52) U.S. Cl.
CPC ............. *F16H 21/44* (2013.01); *F16M 11/04* (2013.01); *H04M 1/02* (2013.01); *H05K 5/0017* (2013.01); *H05K 5/0086* (2013.01); *H05K 5/0217* (2013.01); *E05Y 2900/606* (2013.01)

(56) References Cited

U.S. PATENT DOCUMENTS

| | | | |
|---|---|---|---|
| 2012/0007796 A1* | 1/2012 | Jokinen | H05K 1/189 345/156 |
| 2012/0044620 A1* | 2/2012 | Song | G06F 1/1616 361/679.01 |
| 2014/0211108 A1 | 7/2014 | Matsumoto et al. | |

FOREIGN PATENT DOCUMENTS

| | | |
|---|---|---|
| CN | 206323416 U | 7/2017 |
| CN | 206350038 U | 7/2017 |

OTHER PUBLICATIONS

First Chinese Office Action cited in Chinese Application No. 201611027773.4 dated Jul. 3, 2019, 10 pgs.

* cited by examiner

SUPPORT MECHANISM AND MOBILE TERMINAL

CROSS-REFERENCE TO RELATED APPLICATION

The present application is based upon and claims the priority of PCT Patent Application No. PCT/CN2017/088217, filed on Jun. 14, 2017, which claims benefit of Chinese Patent Application No. 201611027773.4, filed on Nov. 17, 2016. The contents of PCT Patent Application No. PCT/CN2017/088217 and Chinese Patent Application No. 201611027773.4 are incorporated by reference herein in their entirety.

TECHNICAL FIELD

The disclosure relates to the field of electronic equipment, and in particular to a support mechanism and a mobile terminal.

BACKGROUND

With the development of Internet and informatization, electronic products have become a necessity in people's daily life. Now the shapes of electronic products have slowly become homogenized, basically giving the appearance of a bar-phone. Moreover, due to different usage scenarios, when people want to get a good user experience, there is a conflict between the size of a display screen of an electronic product and the volume of the electronic product itself. For example, an electronic product with a small volume is easy to carry, but inevitably the size of its display screen is small, which influences watching experience, and consequently reduces the user experience.

Now, a flexible screen, that is capable of being bended, has been produced in mass, and it can be used as the display screen of the electronic product to solve the conflict between the size of the display screen of the electronic product and the volume of the mobile terminal. As such, the problem to be solved is how to realize a bigger display screen in the same volume of the mobile terminal by a deformable characteristic of the flexible display screen in the electronic product, and provide a better service for users.

SUMMARY

In view of this, the disclosure is intended to provide a support mechanism and a mobile terminal, so as to allow a support for flexible screen of a mobile terminal in an unfolded state, and then set a large-sized display screen without changing the volume of the mobile terminal, thereby taking both portability and large size display of the mobile terminal into consideration, and improving user experience.

To this end, technical solutions of some implementations of the disclosure are implemented as follows.

In accordance with an aspect of the present invention, an example of the disclosure provides a support mechanism, which at least includes a first support plate, a second support plate, and a transmission mechanism for connecting the first support plate with the second support plate. When the support mechanism is in a support state, the first support plate and the second support plate are in a first relative position with respect to each other to form a support surface.

In accordance with another aspect of the present invention, an example of the disclosure provides a mobile terminal, which includes: a first body, a second body connected to the first body, the support mechanism described above, and a display screen. The display screen at least includes: fixed portions fixed to at least one of the first body or the second body, and a deformable portion. The support mechanism is arranged on the second body. When the first body rotates in a first direction, the first body drives the support mechanism to move relative to the second body. When the mobile terminal is in an unfolded state, the fixed portions and the deformable portion are located on a same plane, and the support mechanism supports the deformable portion.

The examples of the disclosure provide a support mechanism and a mobile terminal. The support mechanism includes: a first support plate, a second support plate, a first transmission gear lever, a second transmission gear lever, and a pushing bar. When the pushing bar is acted by an external force, the pushing bar drives the first transmission gear lever to slide relative to the first support plate, and drives the first transmission gear lever to rotate in the first direction. During the rotation of the first transmission gear lever in the first direction, the first transmission gear lever drives, by bring the first gear into engagement with the second gear, the second transmission gear lever to slide relative to the second support plate and rotate in the second direction opposite to the first direction. As such, the first support plate rotates in the first direction, and the second support plate rotates in the second direction, until the first support plate is level with the second support plate to form a plane. In this case, if the support mechanism described in the examples of the disclosure is applied to the mobile terminal, the plane formed by the first support plate and the second support plate is able to support the flexible screen in the mobile terminal. When the mobile terminal is in an unfolded state, the support mechanism is provided to support the flexible screen of the mobile terminal, thereby realizing the setting of a large-sized display screen without changing the volume of the mobile terminal, in consideration of both portability and large size display of the mobile terminal, and thus improving user experience.

DETAILED DESCRIPTION

The technical solutions in the examples of the disclosure are clearly and completely described below in combination with the accompanying drawings in the examples of the disclosure.

First Example

An example of the disclosure provides a support mechanism, which at least includes a first support plate, a second support plate, and a transmission mechanism for connecting the first support plate with the second support plate. When the support mechanism is in a support state, the first support plate and the second support plate are in a first relative position with respect to each other to form a support surface.

When the transmission mechanism is acted by an external force, the transmission mechanism drives the first support plate to rotate in a first direction and drives the second support plate to rotate in a second direction, until the first support plate is level with the second support plate to form the support surface; the first direction is opposite to the second direction.

Figure 1:
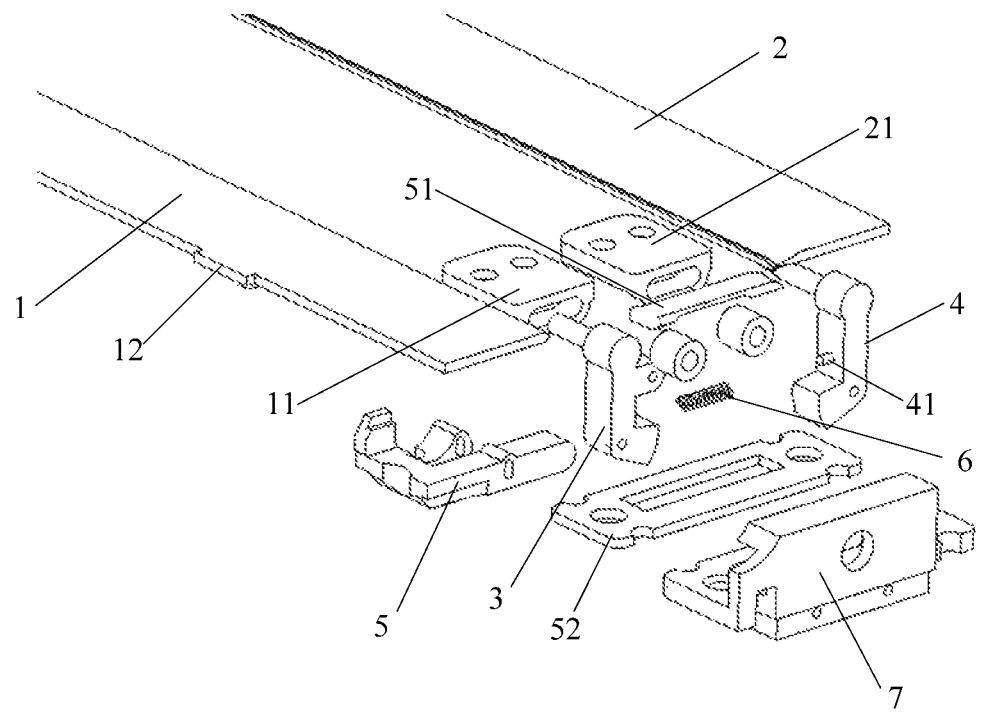
FIG. 1 is a structure diagram of a support mechanism in the first example of the disclosure.

Alternatively, with reference to FIG. 1, the support mechanism may include: the first support plate 1, the second support plate 2, a first transmission gear lever 3, a second transmission gear lever 4, and a pushing bar 5. A first end of the first transmission gear lever 3 is movably connected to the lower surface of the first support plate 1. A first gear is arranged on an end face of a second end of the first transmission gear lever 3. The first transmission gear lever 3 is connected with the pushing bar 5. A third end of the second transmission gear lever is movably connected to the lower surface of the second support plate 2. A second gear is arranged on the end face of a fourth end of the second transmission gear lever 4.

When the pushing bar is acted by an external force, the pushing bar drives the first transmission gear lever to slide relative to the first support plate, and drives the first transmission gear lever to rotate in the first direction. During the rotation of the first transmission gear lever in the first direction, the first transmission gear lever drives, by bring the first gear into engagement with the second gear, the second transmission gear lever to slide relative to the second support plate and to rotate in the second direction, so that the first support plate rotates in the first direction, and the second support plate rotates in the second direction, until the first support plate is level with the second support plate to form a plane.

Here, the first direction is opposite to the second direction. In the examples of the disclosure, the first direction may be counterclockwise, and the second direction may be clockwise.

The support mechanism is elaborated below.

Figure 2:
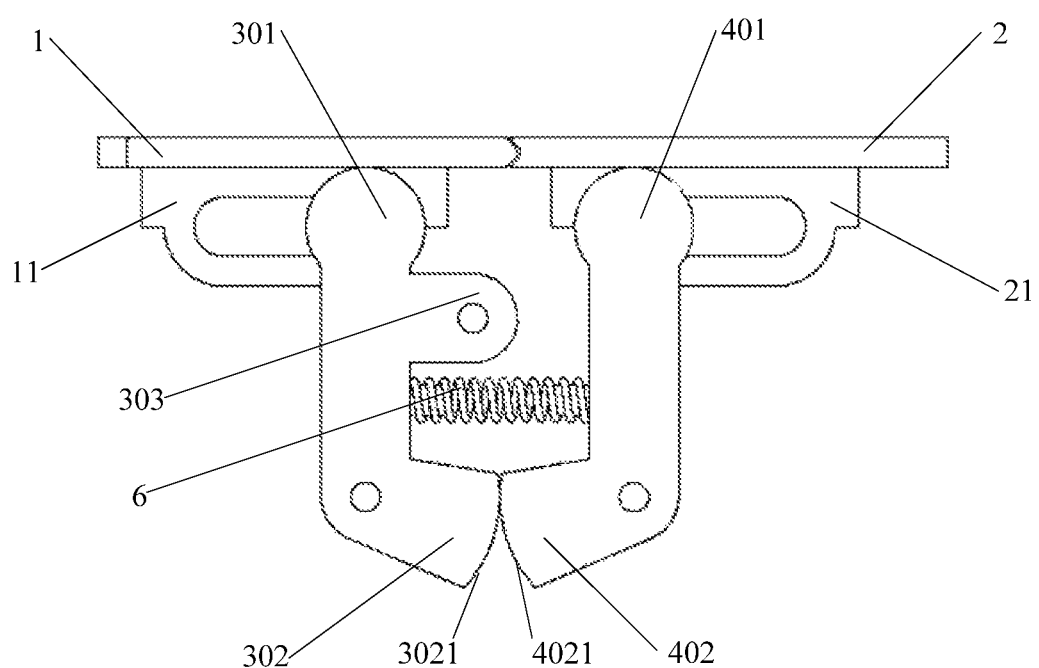
FIG. 2 is a schematic diagram illustrating a relative position relationship between the first transmission gear lever and a second transmission gear lever in a first example of the disclosure.

Firstly, with reference to FIG. 2, a first sliding slot 11 is arranged on the lower surface of the first support plate 1. The first end of the first transmission gear lever 3 is arranged in the first sliding slot 11. A first gear is arranged on the end face 3021 of the second end 302 of the first transmission gear lever 3. A second sliding slot 21 is arranged on the lower surface of the second support plate 2. The third end of the second transmission gear lever 4 is arranged in the second sliding slot 21. A second gear is arranged on the end face 4021 of the fourth end 402 of the second transmission gear lever 4.

Alternatively, the first transmission gear lever 3 has the first end 301 and the second end 302. A solid shaft, namely a first shaft, is arranged on the first end 301. A fixed end of the first shaft is fixed on the first end, and a free end of the first shaft extends into the first sliding slot. In this way, the first shaft slides within the first sliding slot to drive the first transmission gear lever to slide within the first sliding slot. The first gear is arranged on the end face 3021 of the second end 302.

Correspondingly, the second transmission gear lever 4 has the third end 401 and the fourth end 402. A solid shaft, namely a second shaft, is arranged on the third end 402. The fixed end of the second shaft is fixed on the third end, and the free end of the second shaft extends into the second sliding slot. In this way, the second shaft slides within the second sliding slot to drive the second transmission gear lever to slide within the second sliding slot. The second gear is arranged on the end face 4021 of the fourth end 402.

It is should be noted that the end faces of the second end and the fourth end may be curved surfaces with the same radius and curvature. In this case, the number of teeth of the first gear is the same as the number of teeth of the second gear. Certainly, the end faces of the second end and the fourth end may also be the curved surfaces with the same curvature and different radii. The radius of the end face of the second end is less than the radius of the end face of the fourth end, or the radius of the end face of the second end is greater than the radius of the end face of the fourth end. In this case, the number of teeth of the first gear may be different from the number of teeth of the second gear. Certainly, there could be other cases, which do not limit the present disclosure.

With reference to FIG. 2, the first transmission gear lever 3 further includes a third end 303. A through hole is provided on the third end 303, and a through hole is provided on the pushing bar. A solid shaft passes through the through hole on the third end and the through hole on the pushing bar to fix the pushing bar and the first transmission gear lever together. Moreover, since the pushing bar and the first transmission gear lever are fixed through the shaft, they may rotate with respect to each other.

In a practical application, in order to protect the first shaft and the second shaft from the abrasion in the work process of the support mechanism, and to increase damping, a first guard may be mounted around the first shaft, and a second guard may be mounted around the second shaft. Here, both the first guard and the second guard are made of materials with a friction coefficient equal to a first value, for example, nylon or rubber. Certainly, those skilled in the art should understand that the first guard and the second guard may also be made of other materials, which does not limit the examples of the disclosure.

Figure 3A:
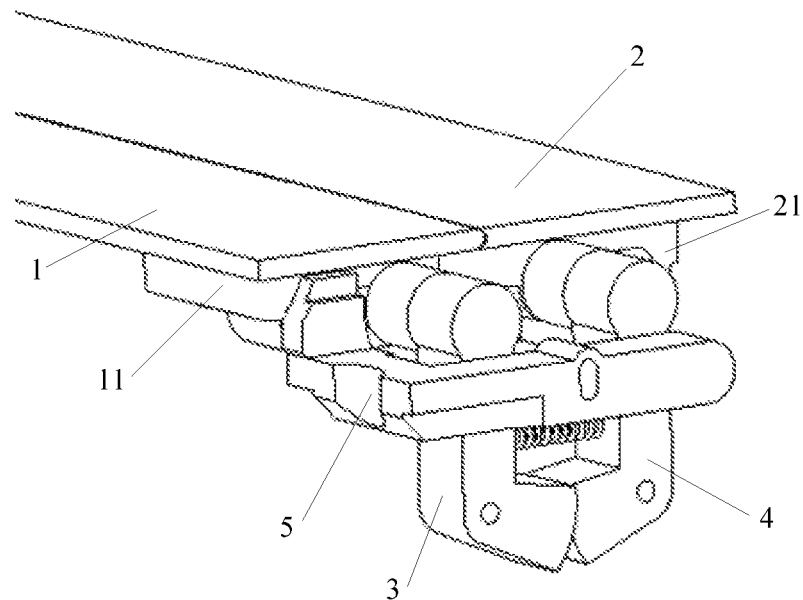
FIG. 3A and FIG. 3B are state diagrams of a support mechanism in the first example of the disclosure.

When the pushing bar is acted by an external force to drive the first transmission gear lever to slide relative to the first support plate, the pushing bar also drives the first transmission gear lever to rotate in the first direction. During the rotation of the first transmission gear lever in the first direction, the first gear engages with the second gear, and then the first transmission gear lever drives the second transmission gear lever to slide relative to the second support plate and to rotate in the second direction, so that the first support plate 1 rotates in the first direction, and the second support plate rotates in the second direction, until the first support plate 1 is level with the second support plate 2 (as illustrated in FIG. 3A) to form a plane; at this point, the support mechanism is in a support state.

In other examples of the disclosure, as illustrated in FIG. 2, a first locating pin may also be arranged on the first transmission gear lever 3, and a second locating pin 41 may be arranged on the second transmission gear lever 4.

Correspondingly, with reference to FIG. 1 and FIG. 2, the support mechanism may also include: a spring 6. One end of the spring is mounted around the first locating pin, and the other end of the spring is mounted around the second locating pin 41. When the first transmission gear lever 3 drives the second transmission gear lever 4 to rotate in the second direction, the spring 6 is compressed. Then, after an external force acted on the pushing bar 5 is removed, the spring generates a restoring force respectively acting on the first transmission gear lever 3 and the second transmission gear lever 4 so as to force the first gear and the second gear to be disengaged with each other, so that the first support plate 1 rotates in the second direction, and the second support plate 2 rotates in the first direction; that is, the first support plate and the second support plate are separated.

Figure 3B:
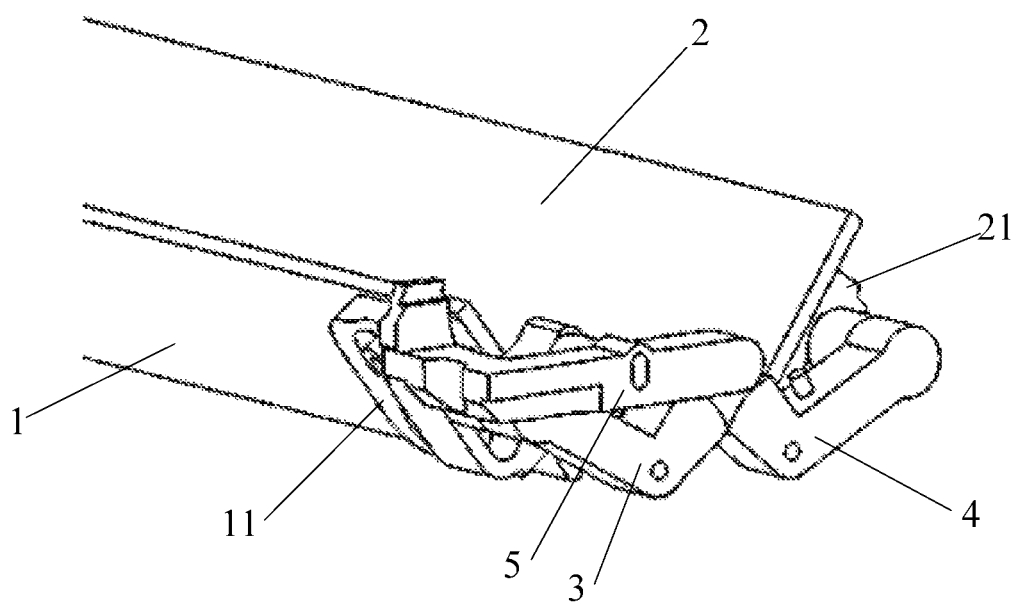
Figure 4:
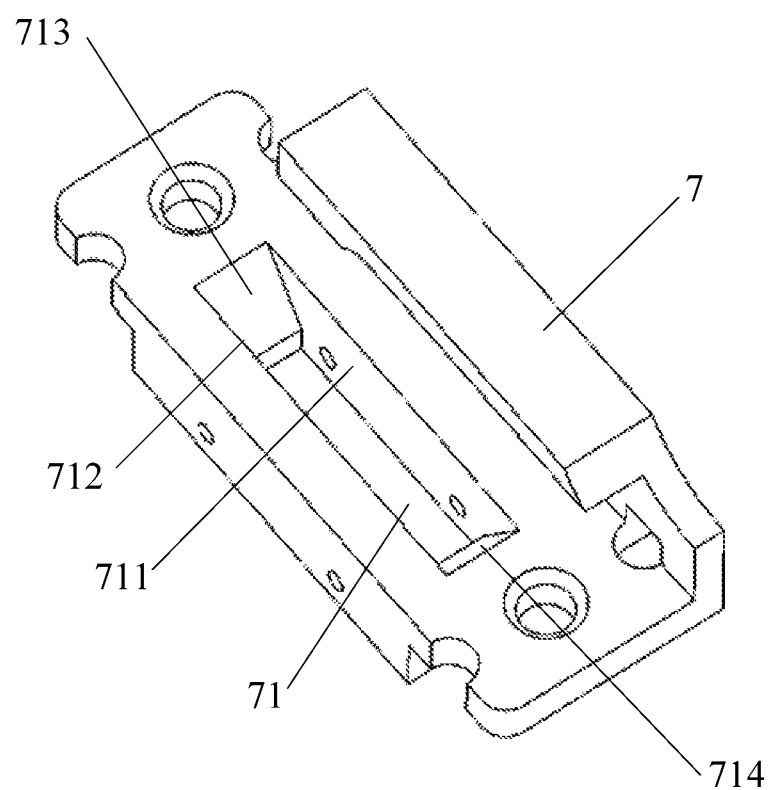
FIG. 4 is a structure diagram of a fixed base in the first example of the disclosure.

In a practical application, as illustrated in FIG. 4, the support mechanism may also include: a fixed base 7, on which a limit slot 71 is provided. The first transmission gear lever and the second transmission gear lever pass through the limit slot 71. The opening width of the limit slot is greater than the sum of widths of the first transmission gear lever and the second transmission gear lever, so that a sliding space for the first transmission gear lever and the second transmission gear lever is left after the first transmission gear lever and the second transmission gear lever pass through the limit slot. Then, with reference to FIG. 3B and FIG. 4, after the first gear and the second gear are disengaged with each other, the first transmission gear lever 3 slides within the first sliding slot 11 and rotates in the second direction under the action of the restoring force, the second transmission gear lever 4 slides within the second sliding slot 21 and rotates in the first direction under the action of the restoring force, until the first transmission gear lever 3 and the second transmission gear lever 4 are engaged with the opening of the limit slot 71. At this point, the first gear and the second gear are in point contact, and the support mechanism restores to a contraction state.

In a practical application, the opening of the limit slot may be rectangular, waist-shaped, oval, and so on, which do not limit the examples of the disclosure.

As illustrated in FIG. 4, the limit slot 71 has a first side wall 711 and a second side wall 712 which are parallel to each other, and a third side wall 713 and a fourth side wall 714 which connect the first side wall 711 with the second side wall 712. The third side wall 713 and the fourth side wall 714 are across from one another. The third side wall 713 is inclined at a first angle, the fourth side wall 714 is inclined at a second angle, and the first angle is a supplementary angle to the second angle. When the first transmission gear lever and the second transmission gear lever are engaged with the opening of the limit slot, the third side wall supports the first transmission gear lever, and the fourth side wall supports the second transmission gear lever.

In an alternative implementation process, the third side wall and the fourth side wall may also not be inclined, but vertical to the first side wall and the second side wall, which does not limit the examples of the disclosure.

As illustrated in FIG. 1, a translation gasket 72 is further arranged on an upper surface of the fixed base 7. When the first transmission gear lever and the second transmission gear lever are engaged with the opening of the limit slot, the translation gasket provides friction for the first transmission gear lever and the second transmission gear lever.

As illustrated in FIG. 1, a gasket 51 is further arranged on the top of the pushing bar 5. When the first transmission gear lever and the second transmission gear lever pass through the limit slot and the pushing bar is moved under the action of the external force, the gasket is configured to increase the friction between the pushing bar and the fixed base.

One end of the first support plate far away from the second support plate may also be provided with at least one rotation shaft. The at least one rotation shaft is configured to be connected with a shell of the mobile terminal when the support mechanism is fixed to the mobile terminal.

A work process of the support mechanism is illustrated below.

When the support mechanism is in the contraction state illustrated in FIG. 3B, the pushing bar 5 is acted by an external force to drive the first transmission gear lever 3 to slide, relative to the first support plate 1, towards the direction close to the second transmission gear lever 4, and drives the first transmission gear lever 3 to rotate in the first direction. During the rotation of the first transmission gear lever 3 in the first direction, the first transmission gear lever 3 drives, by bring the first gear into engagement with the second gear, the second transmission gear lever 4 to slide, relative to the second support plate 2 towards the direction close to the first transmission gear lever 3, and drives the second transmission gear lever 4 to rotate in the second direction, so that the spring 6 is compressed, the first support plate 1 rotates in the first direction, and the second support plate 2 rotates in the secondt direction, until the first support plate is level with the second support plate to form a plane. At this point, the support mechanism is in the support state as illustrated in FIG. 3A.

Next, an external force acted on the pushing bar 5 is removed, then the spring 6 generates the restoring force respectively acting on the first transmission gear lever 3 and the second transmission gear lever 4 so as to force the first transmission gear lever 3 to slide relative to the first support plate 1 towards the direction far away from the second transmission gear lever 4 and rotate in the second direction, and force the second transmission gear lever 4 to slide relative to the second support plate 2 towards the direction far away from the first transmission gear lever 3 and rotate in the first direction, until the first transmission gear lever 3 and the second transmission gear lever 4 are engaged with the limit slot 71. At this point, the first gear and the second gear are in point contact, and the support mechanism restores to the contraction state as illustrated in FIG. 3B.

From the above, if the support mechanism described in the examples of the disclosure is applied to the mobile terminal, the plane formed by the first support plate and the second support plate is able to support the flexible screen in the mobile terminal. When the mobile terminal is not used, the flexible screen may be accommodated in the mobile terminal. When the mobile terminal is in use, the flexible screen may be unfolded and supported by the support mechanism, thereby realizing the setting of a large-sized display screen without changing the volume of the mobile terminal, in consideration of both portability and large size display of the mobile terminal. The user experience is improved.

Second Example

Figure 5:
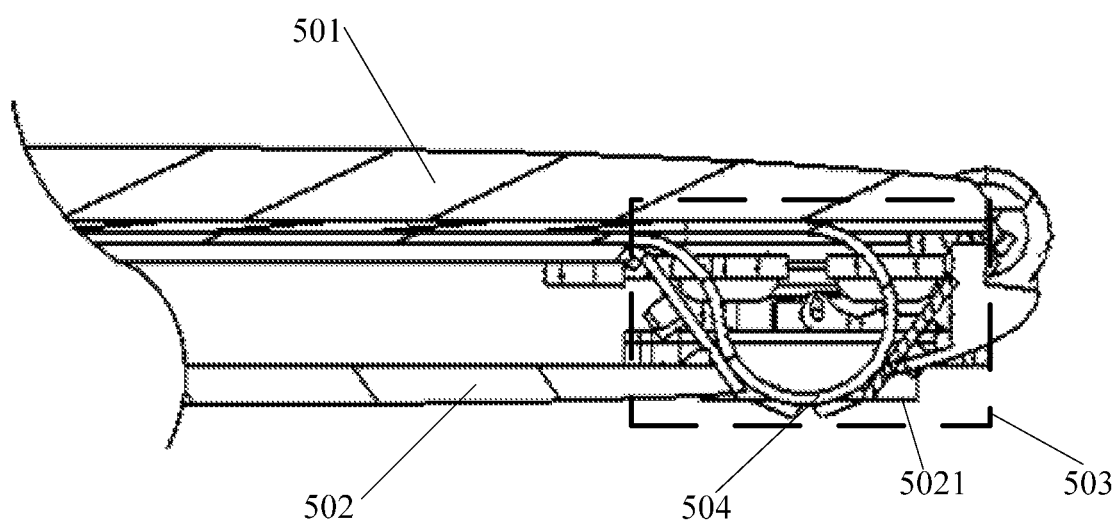
FIG. 5 is a structure diagram of a mobile terminal in the second example of the disclosure.

Based on the same conception, an example of the disclosure also provides a mobile terminal. As illustrated in FIG. 5 (other parts of the terminal are in the blank part on one side of the curve), the mobile terminal includes: a first body 501, a second body 502 rotatably connected to the first body 501, the support mechanism 503 in one or more examples above, and a display screen 504.

Figure 6:
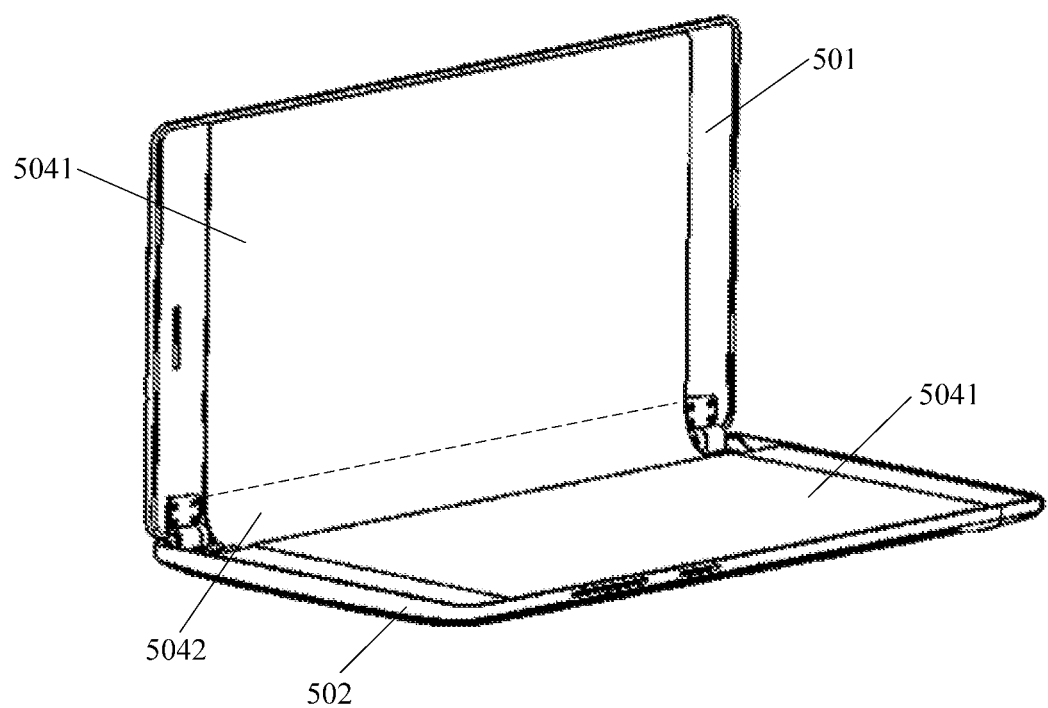
FIG. 6 is a structure diagram of a display screen in the second example of the disclosure.

Here, as illustrated in FIG. 6, the display screen 504 at least includes: fixed portions 5041 fixed to at least one of the first body or the second body, and a deformable portion 5042. The support mechanism is arranged on the second body 502.

As illustrated in FIG. 5, an accommodation slot 5021 provided on the second body 502. When the terminal is in a folded state, the deformable portion is accommodated in the accommodation slot 5021. The support mechanism 503 is accommodated in the accommodation slot 5021, and fixed on the inner wall of the accommodation slot 5021 through the fixed base.

As illustrated in FIG. 1, at least one rotation shaft 12 may also be arranged on one end of the first support plate 1 far away from the second support plate 2. The at least one rotation shaft is connected to the inner wall of the accommodation slot.

The mobile terminal further includes: at least one rotation shaft. The second body is rotatably connected with the first body through at least one rotation shaft.

Figure 7:
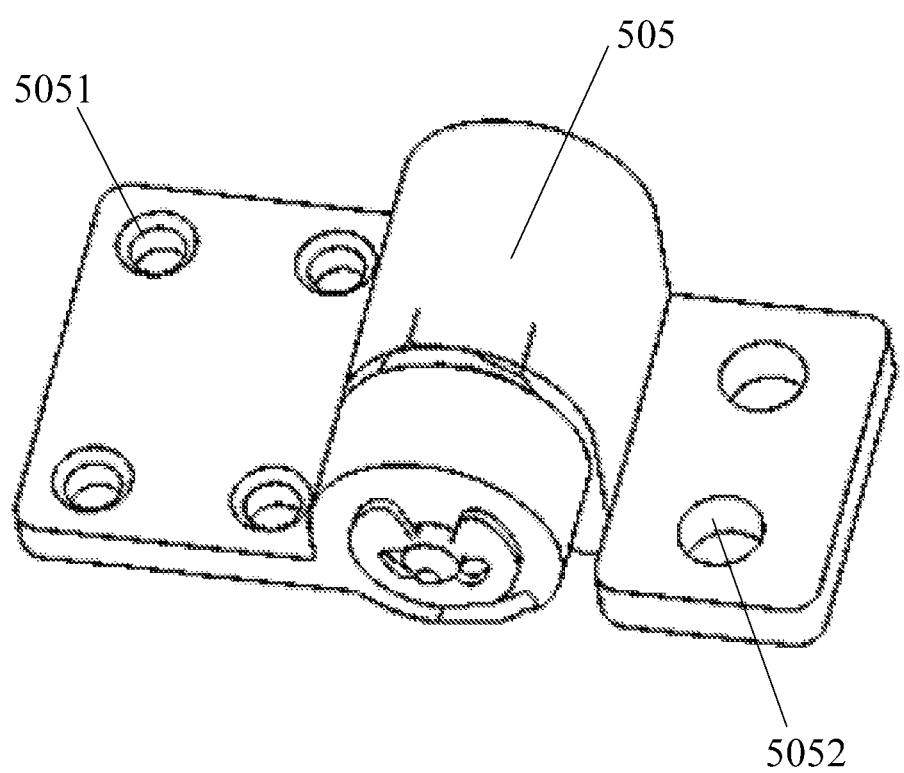
FIG. 7 is a structure diagram of a rotation shaft in the second example of the disclosure.

As illustrated in FIG. 7, a first free end of the rotation shaft 505 is provided with at least one first mounting hole 5051, and a second free end of the rotation shaft 505 is provided with at least one second mounting hole 5052. Correspondingly, at least one riveting pin is arranged on the first body 501. The riveting pin may be connected with the first mounting hole 5051 by riveting. At least one mounting base is arranged on the second body 501. The mounting base may be connected with the second mounting hole 5052 by riveting.

Figure 8:
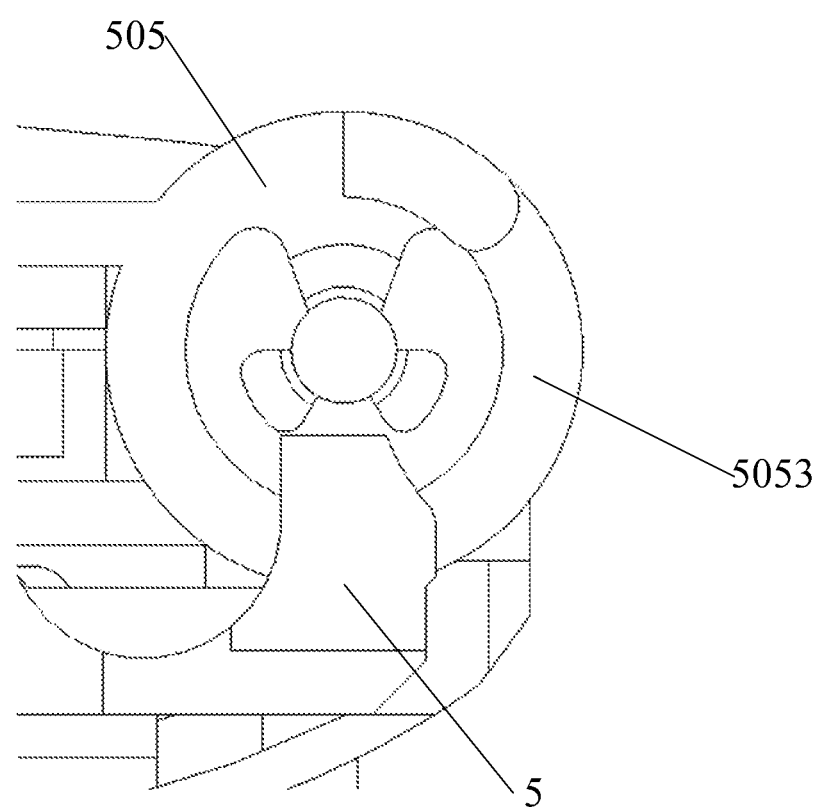
FIG. 8 is a schematic diagram illustrating a relative position relationship between the rotation shaft and the pushing bar in the second example of the disclosure.

Alternatively, as illustrated in FIG. 8, a bayonet 5053 for engaging with the pushing bar 5 in the support mechanism is arranged on a shaft sleeve of the rotation shaft 505. When the rotation shaft 505 rotates, the bayonet 5053 acts an external force on the pushing bar 5, so that the pushing bar 5 drives the first transmission gear lever to move, and then drives the second transmission gear lever to move. Finally, the support mechanism is in the support state, and the plane formed by the first support plate and the second support plate supports the deformable portion of the display screen.

The first body further includes at least one first magnetic component. The at least one first magnetic component is accommodated in a first groove provided on the first body. The second body further includes at least one second magnetic component.

The at least one second magnetic component is accommodated in a second groove provided on the inner wall of the accommodation slot. When the mobile terminal is in the folded state, the at least one first magnetic component magnetically attracts the at least one second magnetic component, so as to fix the first body and the second body. Here, an installation position of at least one second magnetic component corresponds to the installation position of at least one first magnetic component. The accommodation slot on the second body is provided on the end of the second body connected to the first body, while the first groove on the first body is provided on the end of the first body connected to the second body.

In a practical application, the first magnetic component on the first body may be a magnet. Correspondingly, the second magnetic component on the second body may be an iron or a magnet having a polarity opposite to that of the first magnetic component on the first body. Alternatively, the magnetic component on the second body may be a magnet, and correspondingly the first magnetic component on the first body may be an iron or a magnet having a polarity opposite to that of the second magnetic component on the second body. Certainly, the first magnetic component on the first body and the second magnetic component on the second body may also be other magnetic components, which do not limit the present disclosure.

The first body further includes a first structural component and a first shell. A third groove is provided on the outer side of the first structural component. In the third groove, adhesive is accommodated. The first structural component is fixed to the first shell through the adhesive. The second body further includes a second structural component and a second shell. A fourth groove is provided on the outer side of the second structural component. In the fourth groove, adhesive is accommodated. The second structural component is fixed to the second shell through the adhesive. Correspondingly, the fixed portions of the display screen are fixed on at least one of the first structural component or the second structural component. Electronic devices, such as a circuit board, a data line, a loudspeaker, a power supply, and various interfaces, can also be arranged in accommodation space formed by the first structural component and the first shell. The electronic devices, such as the circuit board, the data line, the loudspeaker, the power supply, and various interfaces, can also be arranged in the accommodation space formed by the second structural component and the second shell, which does not limit the examples of the disclosure.

Figure 9A:
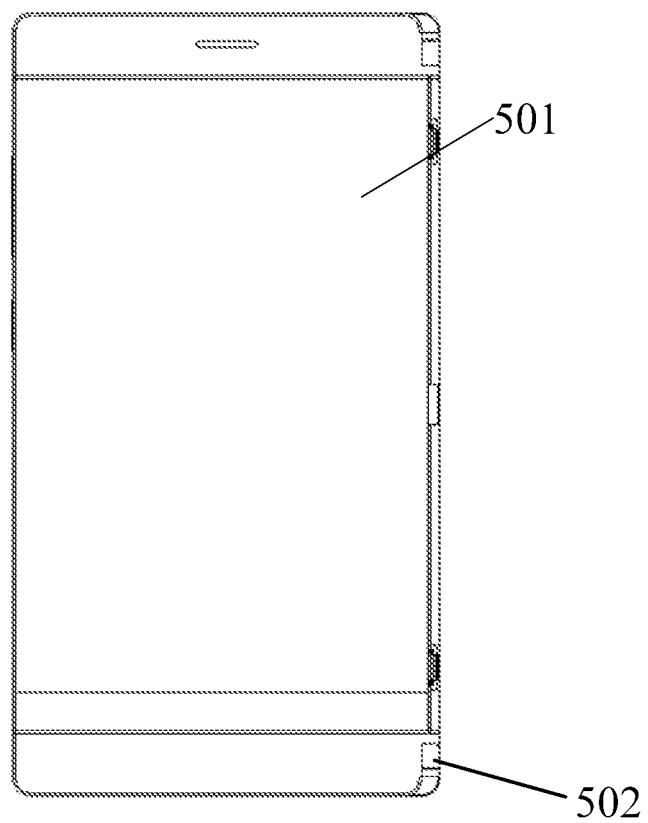
FIG. 9A and FIG. 9B are state diagrams of a mobile terminal in the second example of the disclosure.

A moving process of all the parts is introduced below during the movement of the mobile terminal from the folded state to the unfolded state is described as follows, When the mobile terminal is in the folded state as illustrated in FIG. 9A (other parts of the terminal are in the blank on one side of the curve), the first body 501 faces the second body 502 and is parallel to the second body. Correspondingly, the fixed portion of the display screen fixed on the first body, faces and is parallel to, the fixed portion of the display screen fixed on the second body. The deformable portion of the display screen is accommodated in the accommodation slot provided on the second body. The support mechanism is in the contraction state, the first support plate faces the second support plate aslant, the deformable portion 5042 is located between the first support plate and the second support plate, and the pushing bar does not contact the shaft sleeve of the rotation shaft.

When the user want to use the mobile terminal by changing the mobile terminal from the folded state to the unfolded state, the user uses hand to apply an external force onto the first body, so that the first body rotates counterclockwise relative to the second body. The shaft sleeve of the rotation shaft rotates relative to the axis, and the shaft sleeve of the rotation shaft is gradually close to the pushing bar until it contacts the pushing bar. The support mechanism 503 is still in the contraction state at this moment, while the mobile terminal is in an intermediate state, and the first body and the second body are at an angle of 90 degrees.

Figure 9B:
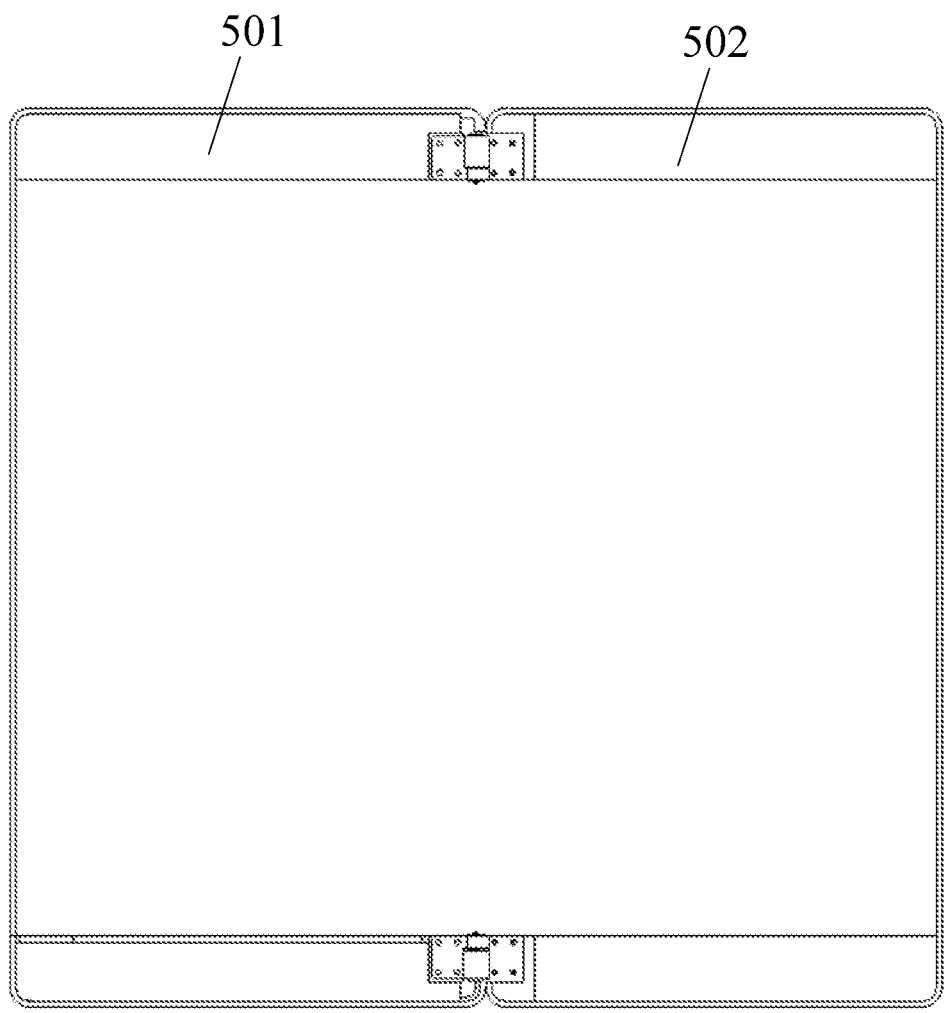

Along with the continuous counterclockwise rotation of the first body relative to the second body, the shaft sleeve apples an external force on the pushing bar to drive the first transmission gear lever to slide relative to the first support plate towards the direction close to the second transmission gear lever, and drive the first transmission gear lever to rotate clockwise. During the clockwise rotation of the first transmission gear lever, the first transmission gear lever drives, by bring the first gear into engagement with the second gear, the second transmission gear lever to slide relative to the second support plate towards the direction close to the first transmission gear lever, and drives the second transmission gear lever to rotate counterclockwise, so that the spring is compressed, the first support plate rotates counterclockwise, and the second support plate rotates clockwise, until the first support plate is level with the second support plate to form a plane to support the deformable portion. At this point, the support mechanism is in the support state, the mobile terminal is in the unfolded state as illustrated in FIG. 9B (other parts of the terminal are in the blank on one side of the curve), and the first body 501 and the second body 502 are at an angle of 180 degrees.

When the user wants to fold the mobile terminal after using the mobile terminal, the shaft sleeve of the rotation shaft rotates quickly relative to the axis, so as to remove the external force acted on the pushing bar, and then, the spring generates the restoring force respectively acting on the first transmission gear lever and the second transmission gear lever, so that the first transmission gear lever slides relative to the first support plate towards the direction far away from the second transmission gear lever while rotating counterclockwise, and the second transmission gear lever slides relative to the second support plate towards the direction far away from the first transmission gear lever while rotating clockwise, until the first transmission gear lever and the second transmission gear lever are engaged with the opening of the limit slot. At this time, the first gear and the second gear are in point contact, the support mechanism restores to the contraction state, the mobile terminal is in the folded state as illustrated in FIG. 9A (other parts of the terminal are in the blank on one side of the curve), and the first body 501 and the second body 502 are at an angle of 0 degree.

Although the alternative examples of the disclosure have been described, once learning the basic creative concept, those skilled in the art can make other changes and modifications to these examples. So, the claims are intended to include the alternative examples and all the changes and modifications in the scope of the disclosure.

It is apparent that those skilled in the art can make various modifications and variations to the disclosure without departing from its spirit and scope. If these modifications and variations of the disclosure belong to the scope of the claims of the disclosure and its equivalent technology, the disclosure is intended to include these modifications and variation.

The invention claimed is:

1. A support mechanism, at least comprising:
 a first support plate,
 a second support plate, and
 a transmission mechanism for connecting the first support plate with the second support plate, wherein:
  when the support mechanism is in a support state, the first support plate and the second support plate are in a first relative position with respect to each other to form a support surface;
  when the transmission mechanism is acted on by an external force, the transmission mechanism drives the first support plate to rotate in a first direction and drives the second support plate to rotate in a second direction, until the first support plate is level with the second support plate to form the support surface; the first direction is opposite to the second direction;
  the transmission mechanism at least comprises: a first transmission gear lever, a second transmission gear lever, and a pushing bar; wherein a first end of the first transmission gear lever is connected to a lower surface of the first support plate; a first gear is arranged on an end face of a second end of the first transmission gear lever; the first transmission gear lever is connected with the pushing bar; a third end of the second transmission gear lever is connected to a lower surface of the second support plate; a second gear is arranged on an end face of a fourth end of the second transmission gear lever;
  when the pushing bar is acted on by the external force, the pushing bar drives the first transmission gear lever to slide relative to the first support plate and drives the first transmission gear lever to rotate in the first direction; during rotation of the first transmission gear lever in the first direction, the first transmission gear lever drives, by bring the first gear into engagement with the second gear, the second transmission gear lever to slide relative to the second support plate and rotate in the second direction, so that the first support plate rotates in the first direction and the second support plate rotates in the second direction, until the first support plate is level with the second support plate to form a plane.

2. The support mechanism as claimed in claim 1, wherein a first sliding slot is arranged on the lower surface of the first support plate; a first shaft is arranged on the first end; a fixed end of the first shaft is fixed at the first end, and a free end of the first shaft extends into the first sliding slot, so that the first transmission gear lever is slidable relative to the first support plate; and
 wherein a second sliding slot is arranged on the lower surface of the second support plate; a second shaft is arranged on the third end; a free end of the second shaft extends into the second sliding slot, so that the second transmission gear lever is slidable relative to the second support plate.

3. The support mechanism as claimed in claim 2, wherein a first guard is mounted around the first shaft, and a second guard is mounted around the second shaft; both of the first guard and the second guard are made of materials having a friction coefficient equal to a first value.

4. The support mechanism as claimed in claim 1, wherein a first locating pin is arranged on the first transmission gear lever, and a second locating pin is arranged on the second transmission gear lever;
 the support mechanism further comprises a spring, one end of the spring being mounted around the first locating pin, and a second end of the spring being mounted around the second locating pin;
 wherein, when the first transmission gear lever drives the second transmission gear lever to rotate in the second direction, the spring is compressed; after the external force acting on the pushing bar is removed, the spring generates a restoring force respectively acting on the first transmission gear lever and the second transmission gear lever, so as to force the first gear and the second gear to be disengaged with each other, so that the first support plate rotates in the second direction and the second support plate rotates in the first direction.

5. The support mechanism as claimed in claim 4, further comprising: a fixed base, on which a limit slot is set; the first transmission gear lever and the second transmission gear lever pass through the limit slot;
 wherein, after the first gear and the second gear are disengaged with each other, the first transmission gear lever slides relative to the first support plate and rotates in the second direction under the action of the restoring force, and the second transmission gear lever slides relative to the second support plate and rotates in the first direction under the action of the restoring force, until the first transmission gear lever and the second transmission gear lever are engaged with an opening of the limit slot.

6. The support mechanism as claimed in claim 5, wherein the limit slot has a first side wall and a second side wall which are parallel to each other, and a third side wall and a fourth side wall which connect the first side wall with the second side wall; the third side wall and the fourth side wall are across from one another; the third side wall is inclined at a first angle, and the fourth side wall is inclined at a second angle, wherein the first angle is a supplementary angle to the second angle; when the first transmission gear lever and the second transmission gear lever are engaged with the opening of the limit slot, the third side wall supports the first transmission gear lever and the fourth side wall supports the second transmission gear lever.

7. The support mechanism as claimed in claim 5, wherein a translation gasket is arranged on an upper surface of the fixed base; when the first transmission gear lever and the second transmission gear lever are engaged with the opening of the limit slot, the translation gasket provides friction for the first transmission gear lever and the second transmission gear lever.

8. The support mechanism as claimed in claim 5, wherein there is also a gasket arranged on a top of the pushing bar; when the first transmission gear lever and the second transmission gear lever pass through the limit slot and the pushing bar is moved under the action of the external force, the gasket is configured to increase friction between the pushing bar and the fixed base.

9. A mobile terminal, at least comprising:
a first body,
a second body connected to the first body,
a support mechanism, and
a display screen; wherein:
the display screen at least comprises: fixed portions fixed to at least one of the first body or the second body, and a deformable portion;
the support mechanism is arranged on the second body;
when the first body rotates in a first direction, the first body drives the support mechanism to move relative to the second body; when the mobile terminal is in an unfolded state, the fixed portions and the deformable portion are located on a same plane and the support mechanism supports the deformable portion;
the support mechanism at least comprises: a first support plate, a second support plate, and a transmission mechanism for connecting the first support plate with the second support plate;
when the support mechanism is in a support state, the first support plate and the second support plate are in a first relative position with respect to each other to form a support surface;
when the transmission mechanism is acted on by an external force, the transmission mechanism drives the first support plate to rotate in the first direction and drives the second support plate to rotate in a second direction, until the first support plate is level with the second support plate to form the support surface; the first direction is opposite to the second direction;
the transmission mechanism at least comprises: a first transmission gear lever, a second transmission gear lever, and a pushing bar; wherein a first end of the first transmission gear lever is connected to a lower surface of the first support plate; a first gear is arranged on an end face of a second end of the first transmission gear lever; the first transmission gear lever is connected with the pushing bar; a third end of the second transmission gear lever is connected to a lower surface of the second support plate; a second gear is arranged on an end face of a fourth end of the second transmission gear lever;
when the pushing bar is acted on by the external force, the pushing bar drives the first transmission gear lever to slide relative to the first support plate and drives the first transmission gear lever to rotate in the first direction; during rotation of the first transmission gear lever in the first direction, the first transmission gear lever drives, by bring the first gear into engagement with the second gear, the second transmission gear lever to slide relative to the second support plate and rotate in the second direction, so that the first support plate rotates in the first direction and the second support plate rotates in the second direction, until the first support plate is level with the second support plate to form a plane.

10. The mobile terminal as claimed in claim 9, wherein a first sliding slot is arranged on the lower surface of the first support plate; a first shaft is arranged on the first end; a fixed end of the first shaft is fixed at the first end, and a free end of the first shaft extends into the first sliding slot, so that the first transmission gear lever is slidable relative to the first support plate; and
wherein a second sliding slot is arranged on the lower surface of the second support plate; a second shaft is arranged on the third end; a free end of the second shaft extends into the second sliding slot, so that the second transmission gear lever is slidable relative to the second support plate.

11. The mobile terminal as claimed in claim 10, wherein a first guard is mounted around the first shaft, and a second guard is mounted around the second shaft; both of the first guard and the second guard are made of materials having a friction coefficient equal to a first value.

12. The mobile terminal as claimed in claim 9, wherein a first locating pin is arranged on the first transmission gear lever, and a second locating pin is arranged on the second transmission gear lever;
the support mechanism further comprises a spring, one end of the spring being mounted around the first locating pin, and a second end of the spring being mounted around the second locating pin;
wherein, when the first transmission gear lever drives the second transmission gear lever to rotate in the second direction, the spring is compressed; after the external force acting on the pushing bar is removed, the spring generates a restoring force respectively acting on the first transmission gear lever and the second transmission gear lever, so as to force the first gear and the second gear to be disengaged with each other, so that the first support plate rotates in the second direction and the second support plate rotates in the first direction.

13. The mobile terminal as claimed in claim 12, further comprising: a fixed base, on which a limit slot is set; the first transmission gear lever and the second transmission gear lever pass through the limit slot;
wherein, after the first gear and the second gear are disengaged with each other, the first transmission gear lever slides relative to the first support plate and rotates in the second direction under the action of the restoring force, and the second transmission gear lever slides relative to the second support plate and rotates in the first direction under the action of the restoring force, until the first transmission gear lever and the second transmission gear lever are engaged with an opening of the limit slot.

14. The mobile terminal as claimed in claim 13, wherein the limit slot has a first side wall and a second side wall which are parallel to each other, and a third side wall and a fourth side wall which connect the first side wall with the second side wall; the third side wall and the fourth side wall are across from one another; the third side wall is inclined at a first angle, and the fourth side wall is inclined at a second angle, wherein the first angle is a supplementary angle to the second angle; when the first transmission gear lever and the second transmission gear lever are engaged with the opening of the limit slot, the third side wall supports the first transmission gear lever and the fourth side wall supports the second transmission gear lever.

15. The mobile terminal as claimed in claim 13, wherein a translation gasket is arranged on an upper surface of the fixed base; when the first transmission gear lever and the second transmission gear lever are engaged with the opening of the limit slot, the translation gasket provides friction for the first transmission gear lever and the second transmission gear lever.

16. The mobile terminal as claimed in claim 13, wherein there is also a gasket arranged on a top of the pushing bar; when the first transmission gear lever and the second transmission gear lever pass through the limit slot and the pushing bar is moved under the action of the external force, the gasket is configured to increase the friction between the pushing bar and the fixed base.

* * * * *